United States Patent
Kim et al.

(10) Patent No.: US 10,615,326 B2
(45) Date of Patent: Apr. 7, 2020

(54) FLEXIBLE THERMOELECTRIC SYSTEM

(71) Applicants: INDUSTRY-ACADEMIC COOPERATION FOUNDATION, YONSEI UNIVERSITY, Seoul (KR); KOREA ADVANCED INSTITUTE OF SCIENCE AND TECHNOLOGY, Daejeon (KR)

(72) Inventors: Woochul Kim, Seoul (KR); Dong Gyu Kim, Seoul (KR); Byung Jin Cho, Daejeon (KR)

(73) Assignees: INDUSTRY-ACADEMIC COOPERATION FOUNDATION, YONSEI UNIVERSITY, Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/617,223

(22) Filed: Jun. 8, 2017

(65) Prior Publication Data

US 2017/0358726 A1 Dec. 14, 2017

(30) Foreign Application Priority Data

Jun. 9, 2016 (KR) .................. 10-2016-0071829

(51) Int. Cl.
*H01L 35/30* (2006.01)
*H01L 35/32* (2006.01)

(52) U.S. Cl.
CPC .............. *H01L 35/30* (2013.01); *H01L 35/32* (2013.01)

(58) Field of Classification Search
CPC ................................. H01L 35/30; H01L 35/32
See application file for complete search history.

(56) References Cited

U.S. PATENT DOCUMENTS

| | | | | |
|---|---|---|---|---|
| 4,930,317 A | * | 6/1990 | Klein | ......................... A61F 7/00 62/259.3 |
| 5,197,294 A | * | 3/1993 | Galvan | ................... F25B 21/02 62/3.62 |

(Continued)

FOREIGN PATENT DOCUMENTS

| KR | 2003-0026510 A | 4/2003 |
|---|---|---|
| KR | 10-1134077 B1 | 4/2012 |

(Continued)

OTHER PUBLICATIONS

Communication dated Dec. 15, 2017, issued by the Korean Patent Office in counterpart Korean Patent Application No. 10-2016-0071829.

*Primary Examiner* — Golam Mowla
(74) *Attorney, Agent, or Firm* — Sughrue Mion, PLLC

(57) ABSTRACT

Disclosed is a flexible thermoelectric system. More particularly, the flexible thermoelectric system includes thermoelectric units that are wearable on the human body; a heating unit that is provided on one side of the thermoelectric units so as to be disposed between the thermoelectric units and the skin and is formed of a hygroscopic and exothermic material; and a heat dissipating unit that is provided on other side of the thermoelectric units such that the heat dissipating unit faces the heating unit and the thermoelectric units are disposed between the heat dissipating unit and the heating unit; wherein the heating unit and the heat dissipating unit are flexible. Due to such a configuration, the flexible thermoelectric system may be flexibly attached to the skin and temperature difference between upper and lower surfaces of the thermoelectric units may be maximized. Accordingly, power generation or cooling performance may be improved.

3 Claims, 4 Drawing Sheets

(56) References Cited

U.S. PATENT DOCUMENTS

| | | | | |
|---|---|---|---|---|
| 5,889,735 | A * | 3/1999 | Kawata | G04C 10/00 136/205 |
| 5,970,718 | A * | 10/1999 | Arnold | A61F 7/10 607/109 |
| 6,125,636 | A * | 10/2000 | Taylor | A61F 7/10 62/259.3 |
| 6,257,011 | B1 * | 7/2001 | Siman-Tov | A41D 13/0056 165/46 |
| 6,297,441 | B1 * | 10/2001 | Macris | H01L 35/32 136/201 |
| 6,438,964 | B1 * | 8/2002 | Giblin | A41D 13/005 62/259.3 |
| 6,681,590 | B1 * | 1/2004 | Jones | A42B 1/008 62/259.3 |
| 7,296,304 | B2 * | 11/2007 | Goldsborough | A42B 3/285 2/171.3 |
| 7,854,754 | B2 * | 12/2010 | Ting | A61F 7/10 607/96 |
| 8,087,254 | B2 * | 1/2012 | Arnold | A41D 13/005 62/3.5 |
| 8,658,943 | B1 * | 2/2014 | Larsen | A61F 7/02 219/211 |
| 10,182,937 | B2 * | 1/2019 | Smith | G01K 1/143 |
| 2006/0169314 | A1 * | 8/2006 | Horio | A61N 1/3785 136/205 |
| 2008/0043809 | A1 * | 2/2008 | Herbert | G01K 1/026 374/163 |
| 2008/0314429 | A1 * | 12/2008 | Leonov | H01L 35/30 136/201 |
| 2009/0293929 | A1 * | 12/2009 | Leonov | H01L 35/32 136/201 |
| 2012/0125334 | A1 * | 5/2012 | Korneff | A61M 11/005 128/203.26 |
| 2012/0198616 | A1 * | 8/2012 | Makansi | H01C 1/16 5/423 |
| 2013/0008181 | A1 * | 1/2013 | Makansi | A47C 21/04 62/3.3 |
| 2014/0224295 | A1 * | 8/2014 | Yazawa | F01K 3/00 136/206 |
| 2016/0118566 | A1 * | 4/2016 | Lee | H01L 35/30 136/205 |

FOREIGN PATENT DOCUMENTS

| | | |
|---|---|---|
| KR | 10-1584683 B1 | 1/2016 |
| KR | 10-20160047843 A | 5/2016 |
| KR | 10-20170048657 A | 5/2017 |

* cited by examiner

FLEXIBLE THERMOELECTRIC SYSTEM

CROSS-REFERENCE TO RELATED APPLICATION

This application claims the priority benefit of Korean Patent Application No. 10-2016-0071829, filed on Jun. 9, 2016 in the Korean Intellectual Property Office, the disclosure of which is incorporated herein by reference.

BACKGROUND OF THE DISCLOSURE

Field of the Disclosure

The present invention relates to a flexible thermoelectric system, more particularly to a flexible thermoelectric system that is capable of improving thermoelectric system performance, such as power generation or cooling, by maintaining a temperature difference between an upper part and a lower part of the flexible thermoelectric system.

Description of the Related Art

A temperature difference between ends of a thermoelectric device causes current to flow therethrough. Such thermoelectric devices are applied to wearable power generators. In this case, the temperature of the human body is a heat source of the thermoelectric devices, and a heat sink is an external environment.

Meanwhile, the human body has a certain body temperature control function to maintain body temperature. As an example of a body temperature control function, the temperature of the skin is properly maintained at a certain temperature through human body mechanisms such as blood flow amount control and sweating. Such human body temperature control, such as sweating, lowers skin temperature of the human body, whereby the temperature of a lower part of a thermoelectric device contacting the human skin is lowered. Such temperature change in thermoelectric devices affects the power generation performance of thermoelectric devices. Accordingly, research into improvement of the performance of thermoelectric devices is being continuously carried out.

RELATED DOCUMENTS

Patent Documents

Korean Patent Application No. 2010-0050599
Korean Patent Application No. 2014-0019511

SUMMARY OF THE DISCLOSURE

Therefore, the present invention has been made in view of the above problems, and it is one object of the present invention to provide a flexible thermoelectric system that may be attached to the skin and may provide performance increase by maximizing temperature difference between upper parts and lower parts of thermoelectric units and maintaining the maximized temperature difference.

In accordance with an aspect of the present invention, the above and other objects can be accomplished by the provision of a flexible thermoelectric system including: thermoelectric units that are wearable on a human body; a heating unit that is provided on one side of the thermoelectric units so as to be disposed between the thermoelectric units and a human skin and is formed of a hygroscopic and exothermic material; and a heat dissipating unit that is provided on other side of the thermoelectric units such that the heat dissipating unit faces the heating unit and the thermoelectric units are disposed between the heat dissipating unit and the heating unit, wherein the heating unit and the heat dissipating unit are flexible.

In accordance with an aspect, the thermoelectric units may be disposed between the heating unit and the heat dissipating unit and are spaced from each other side by side, and flexible bending of the heating unit and heat dissipating unit is not interfered by the thermoelectric units.

In accordance with an aspect, the heating unit may be formed of at least any one of a wool fiber and an acrylic fiber.

In accordance with an aspect, the heat dissipating unit may be formed of a material having high density and high heat capacity.

In accordance with an aspect, the heat dissipating unit may be formed of a phase change material (PCM) including a cool gel mat.

In accordance with an aspect, the flexible thermoelectric system may further include a cooling fan that is arranged to face the heat dissipating unit and thus cools the heat dissipating unit by flowing air in a top-down manner.

In accordance with an aspect, due to temperature difference between one side and other side of the thermoelectric units on which the heating unit and the heat dissipating unit are disposed, power may be generated or the thermoelectric units may be cooled.

In accordance with another aspect of the present invention, there is provided a flexible thermoelectric system including thermoelectric units that are spaced from each other so as to contact a skin; a heating unit that is flexibly disposed on one side of the thermoelectric units contacting skin so as to generate adsorption heat according to sweat absorption; and a heat dissipating unit that is disposed on other side of the thermoelectric units, opposite the one side of the thermoelectric units, so as to dissipate heat, wherein heat dissipation temperature of the heat dissipating unit is maintained by a cooling means.

In accordance with an aspect, the heating unit may be formed of at least any one of a hygroscopic and exothermic wool fiber and acrylic fiber.

In accordance with an aspect, the heat dissipating unit may be formed of a material having high density and high heat capacity.

In accordance with an aspect, the heat dissipating unit may be formed of a phase change material (PCM) including a cool gel mat.

In accordance with an aspect, the cooling means may face the heat dissipating unit and may include a cooling fan for cooling the heat dissipating unit by flowing air in a top-down manner.

In accordance with an aspect, due to temperature difference between other side and one side of the thermoelectric units on which the heating unit and the heat dissipating unit are disposed, power may be generated or the thermoelectric units may be cooled.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

The present invention will now be described more fully with reference to the accompanying drawings, in which exemplary embodiments of the invention are shown.

Figure 1:
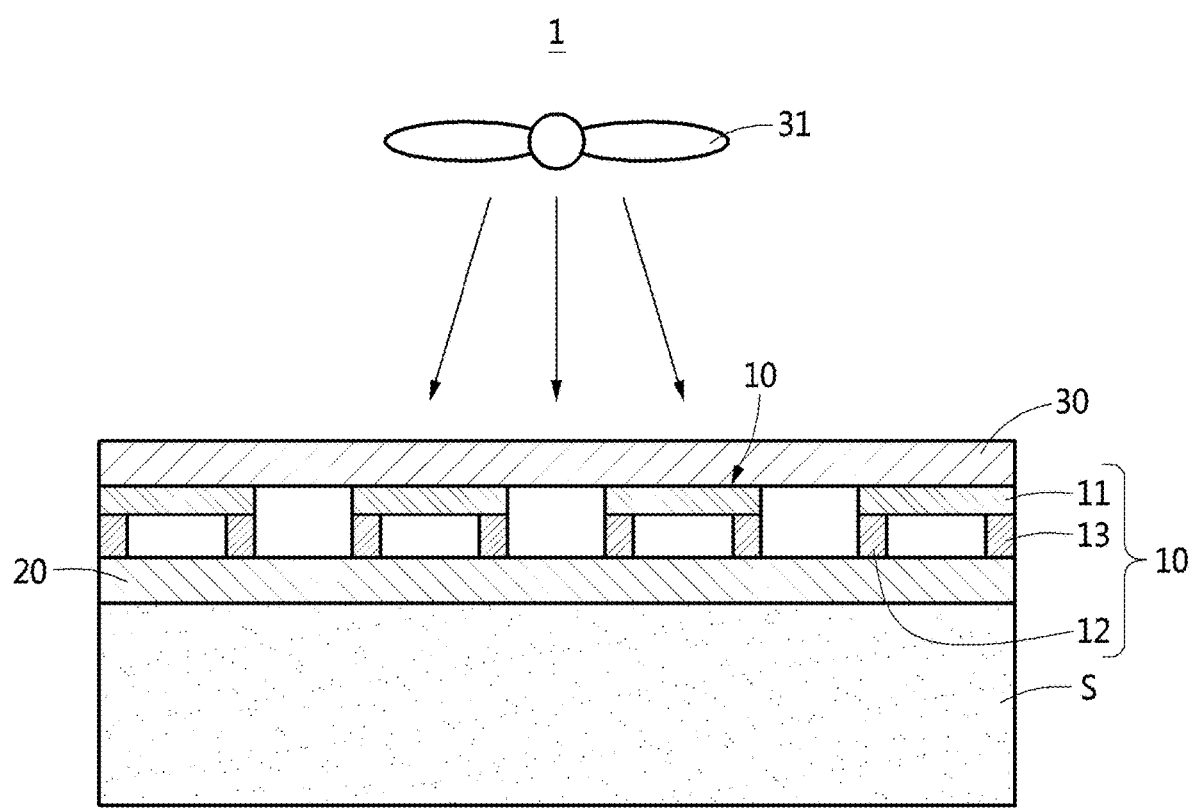
FIG. 1 is a schematic diagram illustrating a flexible thermoelectric system of a preferred embodiment of the present invention.

Referring to FIG. 1, a flexible thermoelectric system 1 according to a preferred embodiment of the present invention includes thermoelectric units 10, a heating unit 20, and a heat dissipating unit 30.

For reference, the flexible thermoelectric system 1 described in the present invention may be employed to supply power to wearable smart devices including a smart watch, a smart band such as a Mi Band, and the like. In addition, the flexible thermoelectric system 1 according to the present invention may be used in various fields, to which a thermoelectric device is applied, such as temperature control seats for automobiles, semiconductors (circulators, cooling palates), bioscience (blood analyzers, PCR machines, sample temperature cycle testers), science (spectrophotometers), optics (CCD cooling, infrared ray sensor cooling, laser diode cooling, photodiode cooling, SHG laser cooling), computers (CPU cooling), home appliances (Kimchi refrigerators, small refrigerators, cold and hot water suppliers, wine refrigerators, rice cookers, dehumidifiers etc.), and power generation (generators using waste power, remote power generation).

The thermoelectric units 10 are wearable on the human body. More particularly, the thermoelectric units 10 are flexible so as to be able to contact the skin S of the human body. Each of the thermoelectric units 10 includes an electrode 11, a P-type thermoelectric material 12, and an N-type thermoelectric material 1. The thermoelectric units 10 are thermoelectric devices using endothermic or exothermic reaction due to Seebeck and Peltier effects.

Figure 2:
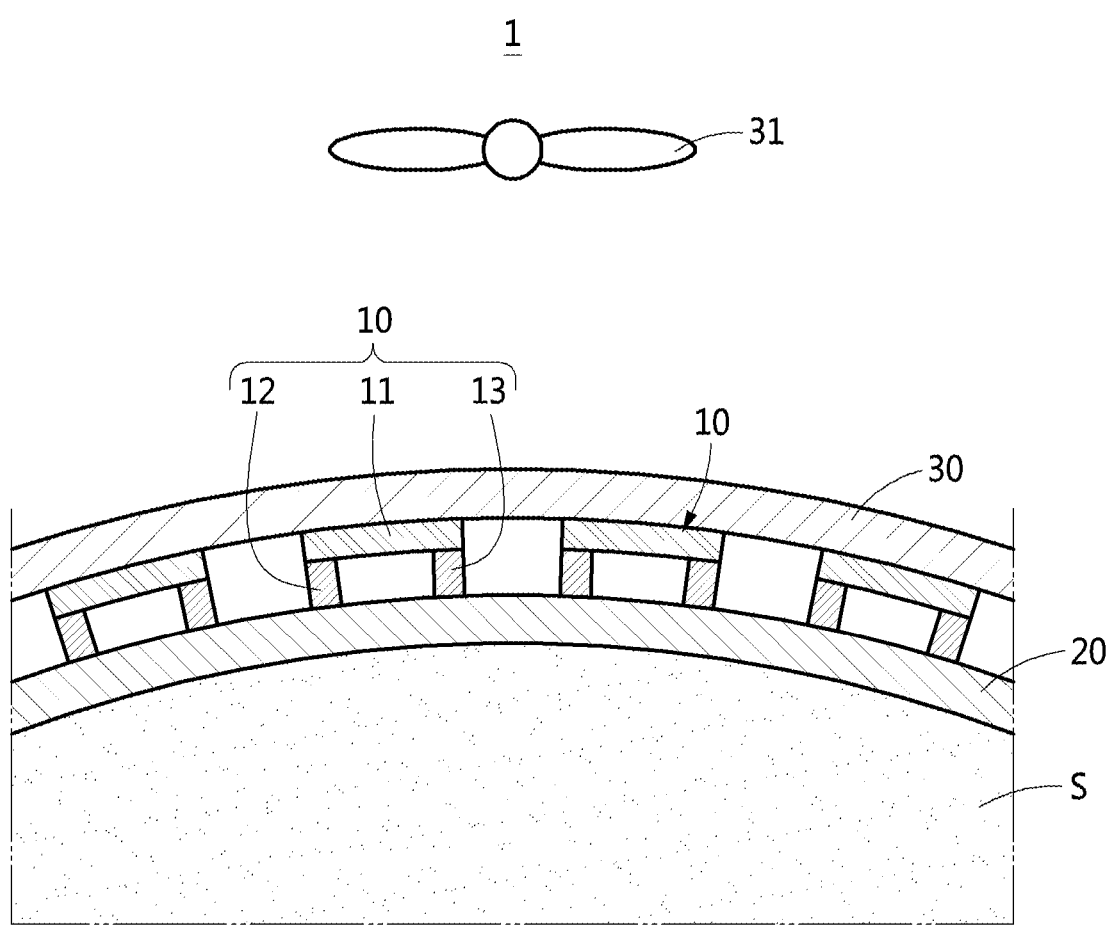
FIG. 2 is a schematic diagram illustrating a state of the flexible thermoelectric system of FIG. 1, which is flexibly attached to the skin.

As illustrated in FIG. 2, a plurality of thermoelectric units 10 is spaced from each other side by side to flexibly contact the skin S. The thermoelectric units 10 have a "⊏" shape rotated by 90 degree. Referring to FIG. 1, a horizontally extending part of each of the thermoelectric units 10 indicates the electrode 11, and one of two vertically extending parts of each of the thermoelectric units 10 indicates the P-type thermoelectric material 12 and the other thereof indicates the N-type thermoelectric material 13.

For reference, the number of the thermoelectric units 10 illustrated in FIGS. 1 and 2 and an interval therebetween are not limited to the illustrated embodiment.

The heating unit 20 is provided on lower surface of the thermoelectric units 10 to be disposed between the thermoelectric units 10 and the skin S. The heating unit 20 has hygroscopic and exothermic properties and is made of a flexible material. Accordingly, the heating unit 20 generates adsorption heat by absorbing sweat generated from the skin S, and thus, increases the temperature of lower parts, which contact the skin S, of the thermoelectric units 10. Here, the heating unit 20 simultaneously supports the plurality of thermoelectric units 10 as illustrated in FIG. 2 to be flexibly bent, thereby increasing adhesion to the skin S.

The heating unit 20 generates adsorption heat by absorbing sweat and prevents evaporation heat loss due to evaporation of sweat. The heating unit 20 evaporates absorbed sweat using a portion of adsorption heat. Accordingly, the heating unit 20 allows a wearer wearing a wearable device, to which the flexible thermoelectric system 1 is applied, to continuously feel comfortable.

Meanwhile, the thermal conductivity of air is 0.03 W/$m^2$·k, whereas the thermal conductivity of the heating unit 20 is 0.04 W/$m^2$·k. That is, the thermal conductivity of the heating unit 20 is higher than that of air, but is relatively lower than other materials. Accordingly, the heating unit 20 has superior insulation. Accordingly, when the skin S is not producing sweat, thermal resistance of the thermoelectric units 10 increases due to the heating unit 20 disposed on lower parts of the thermoelectric units 10. Here, temperature difference increase effect of the thermoelectric units 10 due to the heating unit 20 that blocks evaporation heat loss through sweat is superior to reduction of temperature difference between upper parts and lower parts of the thermoelectric units 10 according to heat transfer amount decrease in a "1-D (thickness)" direction of the thermoelectric units 10.

In an embodiment, the heating unit 20 may include a flexible wool fiber having hygroscopic and exothermic properties and low thermal conductivity, and may be disposed on lower parts of the thermoelectric units 10, but the present disclosure is not limited thereto. In another embodiment, the heating unit 20 may be formed of a synthetic fiber with hygroscopic and exothermic properties, such as an acrylic or synthetic polymer, which generates adsorption heat by absorbing sweat. That is, the heating unit 20 is formed of at least any one of various materials that generate heat by absorbing sweat generated from the skin S.

Data on how the resistance of the heating unit 20 is affected by the thickness of the flexible thermoelectric system 1 is summarized in Table 1 below:

TABLE 1

| Thickness of heating unit (mm) | Temperature of lower part of heating unit (° C.) | Temperature of upper part of heating unit (° C.) | Temperature change amount of heating unit (ΔT) | Temperature of upper part of thermoelectric power generator (° C.) | Temperature of lower part of thermoelectric power generator (° C.) | Temperature change amount of thermoelectric power generator (ΔT) |
|---|---|---|---|---|---|---|
| 0 | — | — | — | 28.81 | 27.92 | 0.88 |
| 0.1 | 32.07 | 31.61 | 0.47 | 31.61 | 30.37 | 1.23 |
| 0.2 | 32.21 | 31.31 | 0.90 | 31.31 | 30.11 | 1.20 |
| 0.3 | 32.33 | 31.03 | 1.31 | 31.03 | 29.86 | 1.16 |

TABLE 1-continued

| Thickness of heating unit (mm) | Temperature of lower part of heating unit (° C.) | Temperature of upper part of heating unit (° C.) | Temperature change amount of heating unit (ΔT) | Temperature of upper part of thermoelectric power generator (° C.) | Temperature of lower part of thermoelectric power generator (° C.) | Temperature change amount of thermoelectric power generator (ΔT) |
|---|---|---|---|---|---|---|
| 0.4 | 32.44 | 30.76 | 1.69 | 30.76 | 29.62 | 1.13 |
| 0.5 | 32.55 | 30.50 | 2.05 | 30.50 | 29.40 | 1.10 |

Figure 3:
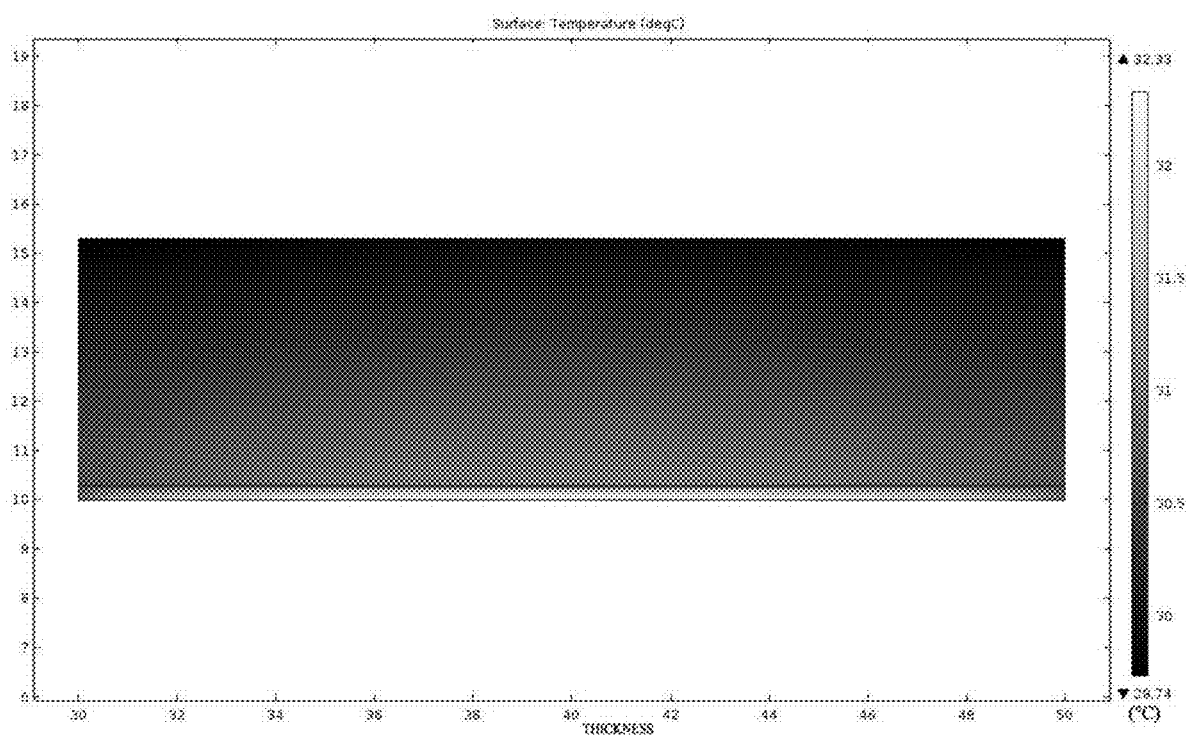
FIG. 3 is a graph schematically illustrating a temperature distribution in a thermoelectric unit that includes a heating unit shown in FIG. 1.

In addition, FIG. 3 is a graph illustrating surface temperature change dependent upon the thickness of the thermoelectric units 10 that includes the heating unit 20. As illustrated in FIG. 3, the temperature of upper parts of the thermoelectric units 10 is higher than the temperature of lower parts of the thermoelectric units 10 including the heating unit 20.

Figure 4:
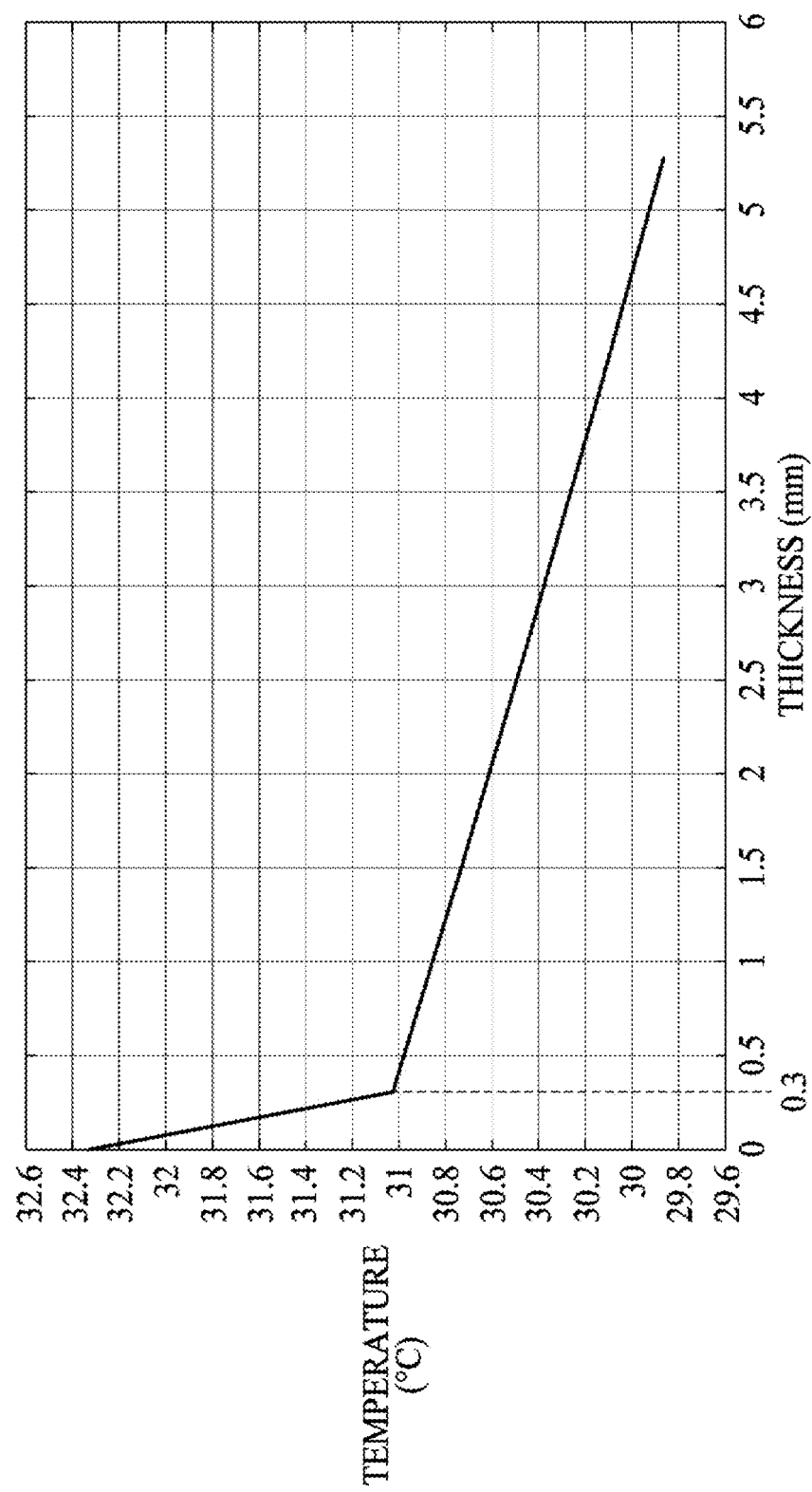
FIG. 4 is a graph schematically illustrating temperature change that depends upon the thicknesses of a heating unit and thermoelectric units shown in FIG. 1.

In addition, FIG. 4 is a graph illustrating temperature change in the case in which the thickness of the heating unit 20 is 0.3 mm and the thicknesses of the thermoelectric units 10 are 5 mm. From the graph of FIG. 4, it can be confirmed that temperature is decreased as the thicknesses of the thermoelectric units 10 increases compared to the thickness of the heating unit 20, and thus, temperature difference between upper parts and lower parts of the thermoelectric units 10 occurs.

The heat dissipating unit 30 is disposed on upper parts of the plurality of thermoelectric units 10 so as to face the heating unit 20, and thus, dissipates heat. The thermoelectric units 10 are interposed between the heat dissipating unit 30 and the heating unit 20. The heat dissipating unit 30 is flexibly disposed on upper surfaces of the thermoelectric units 10, opposite lower surfaces of the thermoelectric units 10 contacting the skin S, thereby flexibly supporting the thermoelectric units 10 and lowering temperature.

The heat dissipating unit 30, which is a heat sink for dissipating heat of the thermoelectric units 10, is formed of a material having a high density and heat capacity. In an embodiment, the heat dissipating unit 30 may include a phase change material (PCM) such as a cool gel mat, thereby lowering the junction temperature of the thermoelectric units 10.

For reference, the PCM material used as a material of the cool gel mat has a specific heat of 2200 J/kg–K, a density of 1850 kg/m$^3$, and a thermal diffusivity ($\alpha$) of 2.7915*10$^{-7}$ m$^2$/s.

In addition, a cooling fan 31, which faces the heat dissipating unit 30 and the cools the heat dissipating unit 30 by flowing air in a top-down manner, is provided to continuously maintain the performance of the heat dissipating unit 30. While a conventional thermoelectric device adopts a down-top flow manner due to temperature difference between an upper part and a lower part, the cooling fan 31 forcibly converts the down-top flow into a top-down flow and thus may continuously and effectively dissipate heat of the heat dissipating unit 30.

An operation mechanism of the flexible thermoelectric system 1 according to the present invention is described with reference to FIGS. 1 and 2.

As illustrated in FIGS. 1 and 2, the plurality of thermoelectric units 10 is provided to contact the skin S. In particular, the flexible heating unit 20, which is formed of a wool material, is formed on lower parts of the thermoelectric units 10, and the flexible heat dissipating unit 30, which include a cool gel mat, is provided on upper parts of the thermoelectric units 10. Due to such a configuration, the heating unit 20 dissipates heat by absorbing sweat generated from the skin S which the heating unit 20 contacts, and thus, increases the temperature of lower parts of the thermoelectric units 10. In addition, the heat dissipating unit 30, which is a heat sink, lowers the temperature of the upper parts of the thermoelectric units 10 and cooling performance of the heat dissipating unit 30 is continuously and effectively maintained due to the cooling fan 31 that flows the air in a top-down manner.

As described above, since temperature difference between upper and lower parts of the flexible thermoelectric system 1 may be constantly maintained regardless of state change such as sweating of a wearer, power generation maintenance performance of the thermoelectric units 10 for generating power may be improved.

Meanwhile, in an embodiment, the power generation property, which allows power supply, of the flexible thermoelectric system 1 is provided through maximization of temperature difference between upper parts and lower parts of the thermoelectric units 10. However, the flexible thermoelectric system 1 has cooling property along with power generation property. More particularly, temperature difference between upper surfaces and lower surfaces of the thermoelectric units 10 due to the presence of the heating unit 20 and the heat dissipating unit 30 is intentionally formed while current is supplied to the thermoelectric units 10, whereby the thermoelectric units 10 of the flexible thermoelectric system 1 have cooling property. That is, lower parts of thermoelectric units 10 absorb heat and upper parts thereof dissipate heat when current is applied to the flexible thermoelectric system 1, and thus, temperature difference between upper parts and lower parts of the thermoelectric units 10 is maximized, whereby the cooling property of the thermoelectric units 10 is improved.

In accordance with the present invention having the aforementioned configuration, first, a heating unit for emitting heat and a heat dissipating unit for dissipating heat are respectively disposed on lower surfaces and upper surfaces of thermoelectric units, and thus, temperature difference occurs between one side and another surface of a thermoelectric unit. Accordingly, performances such as power generation property or cooling property may be improved.

Second, by disposing the heating unit, which includes a wool material, on lower parts of the thermoelectric units attached to the skin, the heating unit absorbs generated sweat and generates heat, whereby the temperature of lower parts of the thermoelectric units increases and the comfort may be improved.

Third, by disposing a cooling means for maintaining the cooling property of the heat dissipating unit to be able to face the heat dissipating unit, the temperature of the heat dissipating unit is maintained and effective cooling is performed. Accordingly, temperature difference between upper parts and lower parts of the thermoelectric units may be maximized.

Fourth, since temperature difference may be constantly maintained while maximizing temperature difference between upper parts and lower parts of the thermoelectric unit, the reliability of a wearer may increase.

Fifth, since the heating unit and the heat dissipating unit are flexibly provided, the wearability of the thermoelectric system contacting the skin may be improved.

While the present invention has been described referring to the preferred embodiments, those skilled in the art will appreciate that many modifications and changes can be made to the present invention without departing from the spirit and essential characteristics of the present invention.

DESCRIPTION OF SYMBOLS

1: FLEXIBLE THERMOELECTRIC SYSTEM
10: THERMOELECTRIC UNIT
20: HEATING UNIT
30: HEAT DISSIPATING UNIT
31: COOLING FAN

What is claimed is:

1. A flexible thermoelectric system, comprising:
thermoelectric units that are wearable on a human body and are flexible;
a heating unit that is provided on one side of the thermoelectric units so as to be disposed between the thermoelectric units and a human skin to contact the human skin and is formed of at least any one of a wool fiber, an acrylic fiber, and a synthetic fiber having hygroscopic and exothermic properties and low thermal conductivity;
a heat dissipating unit that is flexibly provided on other side of the thermoelectric units, the one side being opposite to the other side; and
a cooling fan that is arranged to face the heat dissipating unit and thus cools the heat dissipating unit by flowing air in a top-down manner,
wherein the thermoelectric units are disposed between the heat dissipating unit and the heating unit,
wherein the heating unit increases temperature of lower parts of the thermoelectric units by absorbing sweat generated from the human skin, preventing evaporation heat loss,
wherein the heat dissipating unit is formed of a material with high heat capacity, the heat dissipating unit lowers temperature of upper parts of the thermoelectric unit and a cooling performance of the heat dissipating unit is continuously and effectively maintained due to the cooling fan that flows the air in the top-down manner,
wherein the thermoelectric units are spaced apart from each other with an empty space therebetween, and the temperatures of the heating unit and the heat dissipating unit are transmitted to the one side and the other side of the thermoelectric units, and
wherein electric power is generated or the thermoelectric units are cooled according to temperature difference between the one side of the thermoelectric units and the other side of the thermoelectric units on which the heating unit and the heat dissipating unit are provided.

2. The flexible thermoelectric system according to claim 1, wherein the material of the heat dissipating unit has high density.

3. The flexible thermoelectric system according to claim 1, wherein the material of the heat dissipating unit is a phase change material (PCM) including a cool gel mat.

* * * * *